(12) United States Patent
Kunimori et al.

(10) Patent No.: US 7,589,305 B2
(45) Date of Patent: Sep. 15, 2009

(54) DISPLAY DEVICE HAVING SWITCHING ELEMENTS CORRESPONDING TO INDIVIDUAL PIXELS AND DUAL AMBIENT LIGHT PHOTOSENSING UNIT

(75) Inventors: Takashi Kunimori, Tottori (JP);
Yasushi Yamazaki, Azumino (JP);
Masanori Yasumori, Tottori (JP)

(73) Assignee: Epson Imaging Devices Corporation (JP)

( * ) Notice: Subject to any disclaimer, the term of this patent is extended or adjusted under 35 U.S.C. 154(b) by 38 days.

(21) Appl. No.: 12/011,909

(22) Filed: Jan. 30, 2008

(65) Prior Publication Data

US 2008/0185501 A1 Aug. 7, 2008

(30) Foreign Application Priority Data

Feb. 6, 2007 (JP) ............................. 2007-026441

(51) Int. Cl.
*H01L 27/00* (2006.01)
(52) U.S. Cl. ............................... 250/208.1; 250/214 AL
(58) Field of Classification Search .............. 250/208.1, 250/214 R, 214 AI, 214 D, 221; 345/204–207, 345/76–104, 173–175; 257/59–72
See application file for complete search history.

(56) References Cited

U.S. PATENT DOCUMENTS 7,218,048 B2 * 5/2007 Choi et al. .................. 313/504

FOREIGN PATENT DOCUMENTS

| JP | 04-254820 | 9/1992 |
|---|---|---|
| JP | 09-034635 | 2/1997 |
| JP | 11-084426 | 3/1999 |
| JP | 2001-169190 | 6/2001 |

* cited by examiner

*Primary Examiner*—Que T Le
(74) *Attorney, Agent, or Firm*—Harness, Dickey & Pierce, P.L.C.

(57) ABSTRACT

With the related art, the choice of locations for disposition of ambient light photosensors is narrow, and consequently it is difficult to respond flexibly to user specifications for differing structures of the case. With a display device of the invention however, ambient light photosensors can be disposed laterally and longitudinally, enabling the intensity of light in longitudinal or lateral directions to be sensed at the same levels. Also, bridge-connecting together the longitudinally-disposed ambient light photosensors enables ambient light photosensors to be disposed close to the outer periphery of the display area in both the longitudinal and lateral directions. Thereby, the problems with the related art can be resolved.

5 Claims, 10 Drawing Sheets

DISPLAY DEVICE HAVING SWITCHING ELEMENTS CORRESPONDING TO INDIVIDUAL PIXELS AND DUAL AMBIENT LIGHT PHOTOSENSING UNIT

BACKGROUND

1. Technical Field

The present invention relates to ambient light photosensors and to a display device using such. More particularly it relates to a display device with improved ambient light photosensor directionality.

2. Related Art

Over recent years the use of display devices has spread rapidly not only in telecommunications equipment but also in electrical equipment in general. To reduce power consumption, ambient light photosensors have been installed in liquid crystal panels, especially in those for portable equipment. The method used is that the ambient light photosensors sense the brightness of the ambient light, and the backlight or similar is controlled to turn on/off according to the results of such sensing.

An example which will serve to describe the operation of such an ambient light photosensor is the ambient light photosensor set forth in JP-A-2001-169190, wherein thin film transistors (TFTs) for photosensing are disposed on the substrate of a liquid crystal display panel, and the device has the ability, through sensing of the TFTs' light leakage current, to have the backlight turn on/off automatically according to the brightness of the surroundings. It is set forth therein how introduction of such ambient light photosensors reduces wasteful power consumption and renders the display screen better viewable through having brightness that matches the ambient conditions.

Ambient light photosensors of the related art are disposed in the display area's vacant regions where they will receive ambient light, as for example shown in FIG. 9. Electrical current flows in the semiconductor layer of the ambient light photosensors as a result of ambient light striking the photosensing portion thereof. When such current flows, the accumulated electrical charge is discharged. The duration of such discharge is proportional to the intensity of the ambient light, the photosensors having the characteristic that the more intense the ambient light, the faster the speed at which the charge is discharged. Methods have also been examined whereby, to match such purpose, multiple ambient light photosensors are disposed around the display area's periphery so as to increase the area over which light shines onto the light sensors and render the light more readily absorbed, thereby raising the ambient light photosensor sensitivity. Also, if a single ambient light photosensor is disposed in a vacant region of some equipment incorporated in the display device, there will be situations where the photosensor is blinded by some inadvertent movement of the user's fingers, or where, if light alternately shines on and is blocked from the photosensor for momentary durations due to the effects of the surrounding environment, the brightness of the backlight will frequently fluctuate or be irregular in other ways and it will not necessarily be possible to maintain the backlight at the desired brightness. The method of disposing multiple ambient light photosensors at the display periphery was also devised in order to avoid situations of that kind.

Accordingly, methods were devised whereby ambient light photosensors are arrayed at the periphery of the display area, in directions parallel to the signal lines and parallel to the scan lines, as for instance set forth in JP-A-9-34635. This was in order, by designating the ambient light photosensors parallel to the signal lines as "Y" and those parallel to the scan lines as "X", and by expressing the intersections of two light-receiving elements as (X, Y) and causing shade to appear at such intersections, to use the photosensors as a pointing device for specifying X, Y coordinate two-dimensional positions.

Following that, a method was devised whereby the external wiring and ambient light photosensors are disposed with the display unit therebetween, and there are built-in image sensors on at least one of the display unit's edges, parallel to such edge(s), as set forth in JP-A-11-84426. JP-A-11-84426 describes a structure whereby n ambient light photosensors are disposed in locations distanced from the terminals of the leads to the external wiring, and from the display periphery circuits, in order to prevent the ambient light photosensor sensitivity from falling due to the effects of heat emitted by the display periphery circuits or noise from the high frequency signals. Thereby, ambient light photosensors with good sensitivity are provided.

Ambient light photosensors of the related art are, as FIG. 9 shows, disposed with the drive circuits and display area therebetween, on opposite sides or in directions parallel to the signal lines. However, ambient light photosensors are disposed parallel to the signal lines only when the wiring is one-sided, as in other cases they would be obstructed by the external wiring. But with one-sided wiring, regions where the ambient light photosensors can be disposed exist only on one side, so that there are restrictions on the locations where the photosensors can be disposed. Also, the spacing between the scan lines is narrow, and when the ambient light photosensors are disposed, the size of one ambient light photosensor will be that of one such spacing between the scan lines, as shown in FIG. 10Z. As a result, the sensitivity of the ambient light photosensors will not be high, and it will be difficult to accommodate the light sensor layout to the differing device case specifications of each user. Accordingly, there has arisen a need to raise the directionality, and to raise the light sensor sensitivity, by diversifying the light sensor disposition locations beyond the layouts of the related art. As mentioned in the foregoing descriptions of the related art, JP-A-9-34635 and JP-A-11-84426 disclose structures which have a display unit equipped with sensor units, plus peripheral drive circuit portions, and in which the peripheral drive circuit portions are disposed along at least one edge of the display unit, and image sensors are disposed along another edge of the display unit. However, JP-A-9-34635 sets forth a pointing device, and the basic structure therein is at variance with the intended purpose of sensors. The photosensors set forth therein are characterized by being disposed in longitudinal and lateral directions at the display area periphery, and function as pointing sensors enabling determination of the positions of the intersections (X, Y) of those two directions. Therefore, the photosensors will have lengths that are the same as the lengths of the side edges of the display area, and the lengths of the light sensors parallel to the signal lines are likely to differ from those parallel to the scan lines, depending on the panel's inch-size and shape. Further, in JP-A-11-84426, it is set forth that the locations where the light sensors are disposed are distanced from the peripheral drive circuit portions, the light sensors being disposed at display area peripheral portions that have the peripheral drive circuit portions located therebetween. Also, the light sensors set forth in JP-A-11-84426 may be disposed in various different sizes, and thus the structure is not one that pays heed to photo-directionality. Further, no consideration is given therein to the wiring regions occupied by pixel drive wiring, and thus it would be difficult to dispose multiple sensors close to the display area.

Where ambient light photosensors parallel to the signal lines and ambient light photosensors parallel to the scan lines are provided, a structure is anticipated in which either one or the other of such sensor sets will be employed, according to the user's specification. If the size of the ambient light photosensors disposed parallel to the signal lines differs from that of the ambient light photosensors disposed parallel to the scan lines, then the photo-directionality and photo-sensitivity of such two sensor sets will differ, and consequently situations will arise in which the sensitivity in one direction is good but the sensitivity in the other direction is poor. And there is also concern that, not being disposed in positions proximate to the display area periphery, the light sensors will be hidden by the device's case and be unable to fulfill their function.

SUMMARY

An advantage of some aspects of the present invention is to provide a display device in which the light sensors are disposed over more extensive regions and which is so structured as to have high sensitivity and enhanced directionality.

According to an aspect of the invention, a display device having light sensors with enhanced directionality includes: a display unit having switching elements provided on a substrate so as to correspond to individual pixels, a first photosensing unit having first light sensors that sense ambient light, and a second photosensing unit having second light sensors that sense ambient light; and has the feature that the first photosensing unit is disposed along an outer edge of the display unit, and the second photosensing unit is disposed along an outer edge of the display unit that is orthogonal to the direction in which the first photosensing unit is disposed.

As another feature, the sizes of the first light sensors and the second light sensors may be equal. As a further feature, the display device may have a third photosensing unit having third light sensors, with the third photosensing unit being disposed in a position opposing the second photosensing unit, so that the display unit is located therebetween. As a still further feature, the size of the first light sensors may be equal to the combined sizes of the second light sensors and the third light sensors. As a yet further feature, the display unit may have thin film transistors as switching elements; scan lines that are connected to the gate electrodes of the thin film transistors; and signal lines that are connected to the source electrodes of the thin film transistors; with the scan lines or the signal lines being extended exterior to the display device, such wiring extensions crossing over the second and third photosensing units, the second and third light sensors being disposed in between such wiring extensions, and adjacent light sensors being electrically connected via bridging connections formed by wires that cross the scan line wiring extensions.

According to an aspect of the present invention, the disposition of the ambient light photosensors in orthogonal directions enables the intensity of light in the longitudinal direction and in the lateral direction to be sensed at the same levels. Also, according to the invention, the light sensors are connected by bridgings, and thereby it is possible to dispose the light sensors close to the outer edges of the display area in both the longitudinal and lateral directions.

The aforementioned bridging connections refer to connections whereby the source electrodes of the TFTs, which constitute the photosensing units, are formed straddling the gate electrodes thereof like bridges, thus electrically connecting the photosensing units.

BRIEF DESCRIPTION OF THE DRAWINGS

The invention will be described with reference to the accompanying drawings, wherein like numerals reference like elements.

DESCRIPTION OF EXEMPLARY EMBODIMENTS

Exemplary embodiments of the present invention will now be described with reference to the accompanying drawings. It should be understood, however, that the following embodiments are intended by way of example of display devices that carry out the technical concepts of the invention, not by way of limiting the invention to these particular display devices. The invention can equally well be applied to other embodiments without departing from the scope and spirit of the claims. The characterizing feature of the invention is that it enhances ambient light photosensor sensitivity by disposing, between alternately disposed scan lines, ambient light photosensors that have twice the usual area and have bridge-like structure. It also enables enhancement of the photo-directionality, by disposing lateral ambient light photosensors along the vicinity of the display unit periphery and disposing other ambient light photosensors longitudinally, in a perpendicular configuration.

First Embodiment

Figure 1:
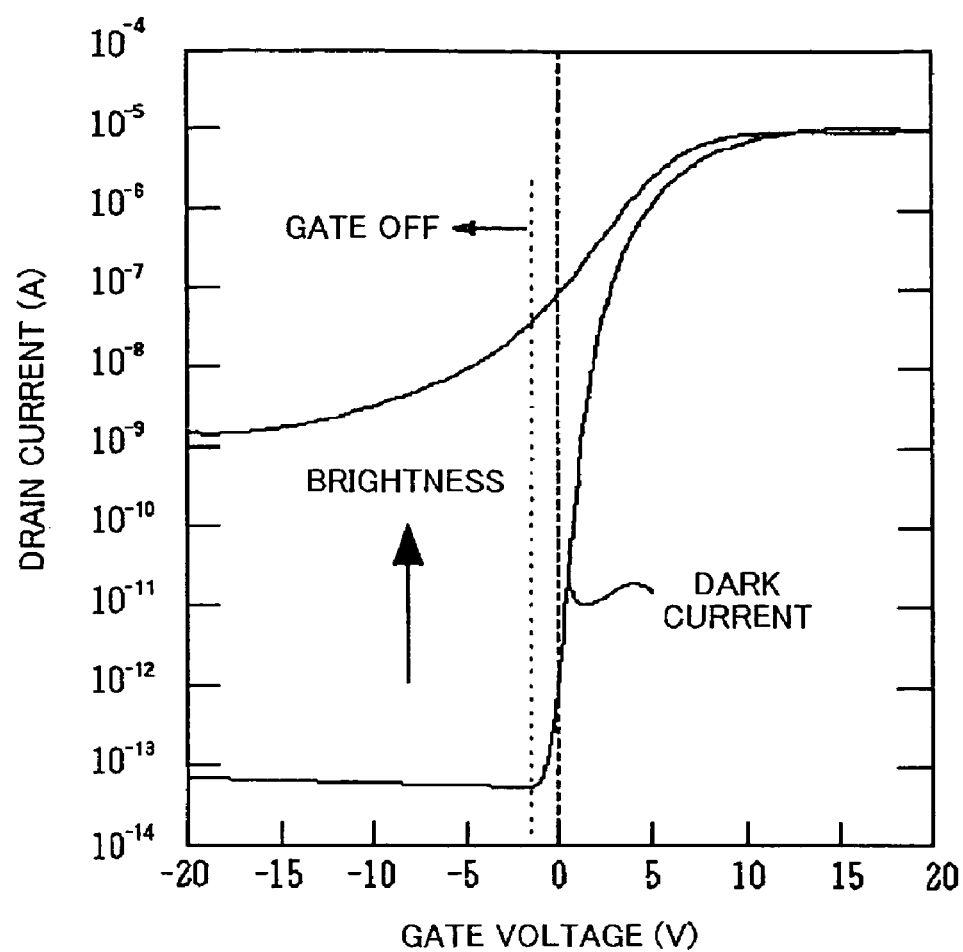
FIG. 1 is a graph showing an example of voltage versus current curves for TFT ambient light photosensors.
Figure 2:
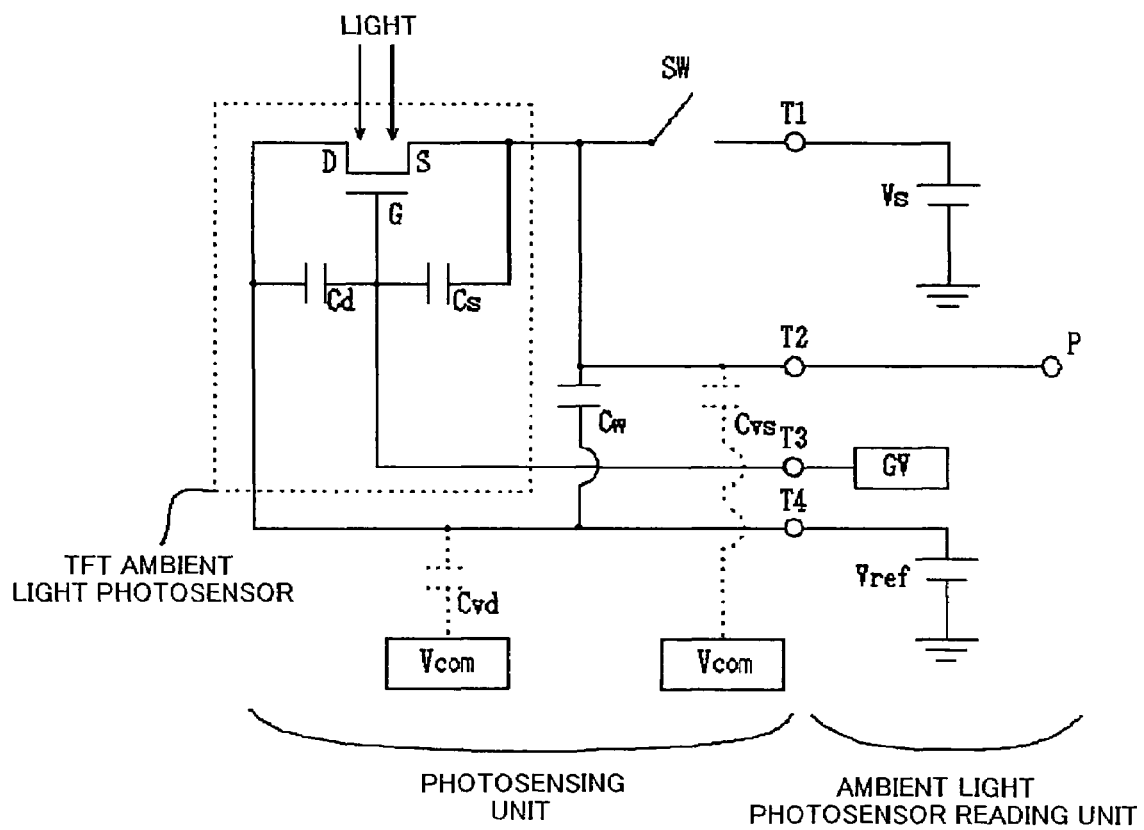
FIG. 2 is a circuit diagram of a photosensing unit that uses the TFT ambient light photosensors.
Figure 3:
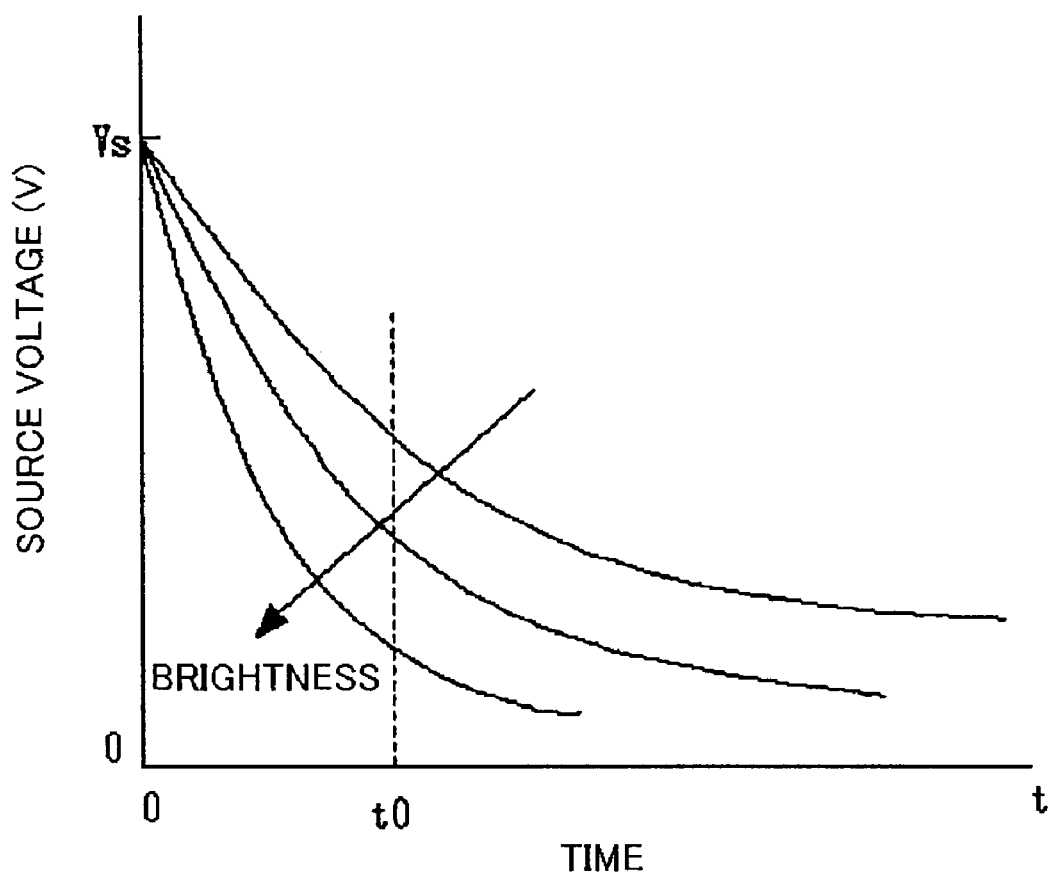
FIG. 3 is a graph showing the voltage versus time curves for the two terminals of the capacitor in the circuit diagram shown in FIG. 2 in the case where the brightness differs.

TFT ambient light photosensors have a structure identical to TFTs used as switching elements in an active matrix type display panel. As FIG. 1 shows, these TFT ambient light photosensors have the characteristic that when light to them is blocked, an extremely feeble dark current flows in their gate OFF region, but when light strikes their channel region, the leakage current becomes large in accordance with the intensity (brightness) of the light. Thus, as the circuit diagram in FIG. 2 shows, each external connection terminal T1, T2, T3, T4 applies to the TFT ambient light photosensor's gate electrode G a fixed bias voltage (say −10V) that constitutes the gate OFF region, and, after a switch SW is turned on, applies to both terminals of a capacitor Cw a fixed voltage V2 (say +2V); when the switch SW is subsequently turned off, the voltage at the two terminals of the capacitor Cw falls with time, as FIG. 3 shows, via the mediation of T1 and in accordance with the brightness of the TFT ambient light photosensor's surroundings. This means that the brightness of the TFT ambient light photosensor's surroundings can be determined by measuring the voltage at the two terminals of the capacitor Cw at a certain time t0 after the switch SW is turned off, since a relationship of inverse proportion obtains between such voltage and the brightness of the TFT ambient light photosensor's surroundings.

Photosensing units containing the foregoing TFT ambient light photosensors will now be described together with the manufacturing method for an active matrix type display device.

Figure 4:
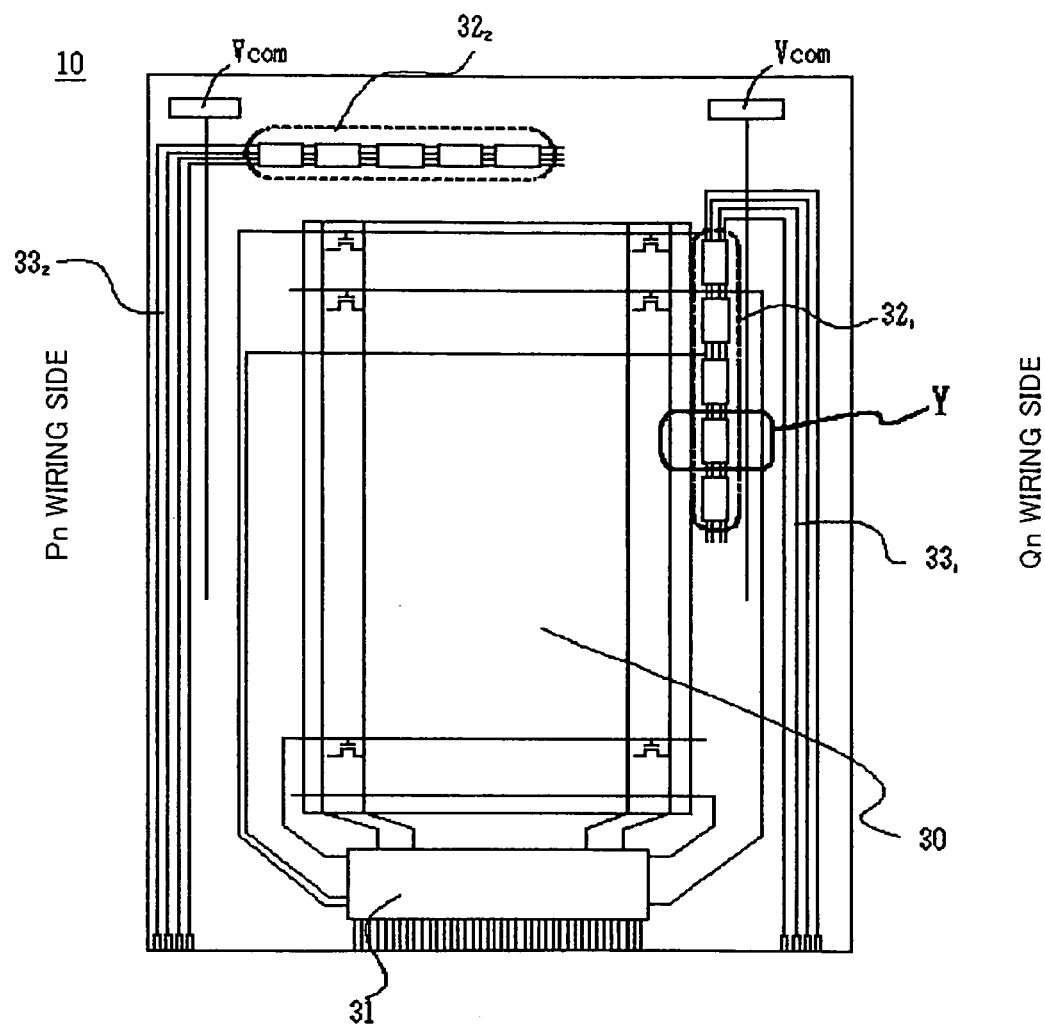
FIG. 4 is a plan view of a display device in a first embodiment of the present invention.
Figure 5:
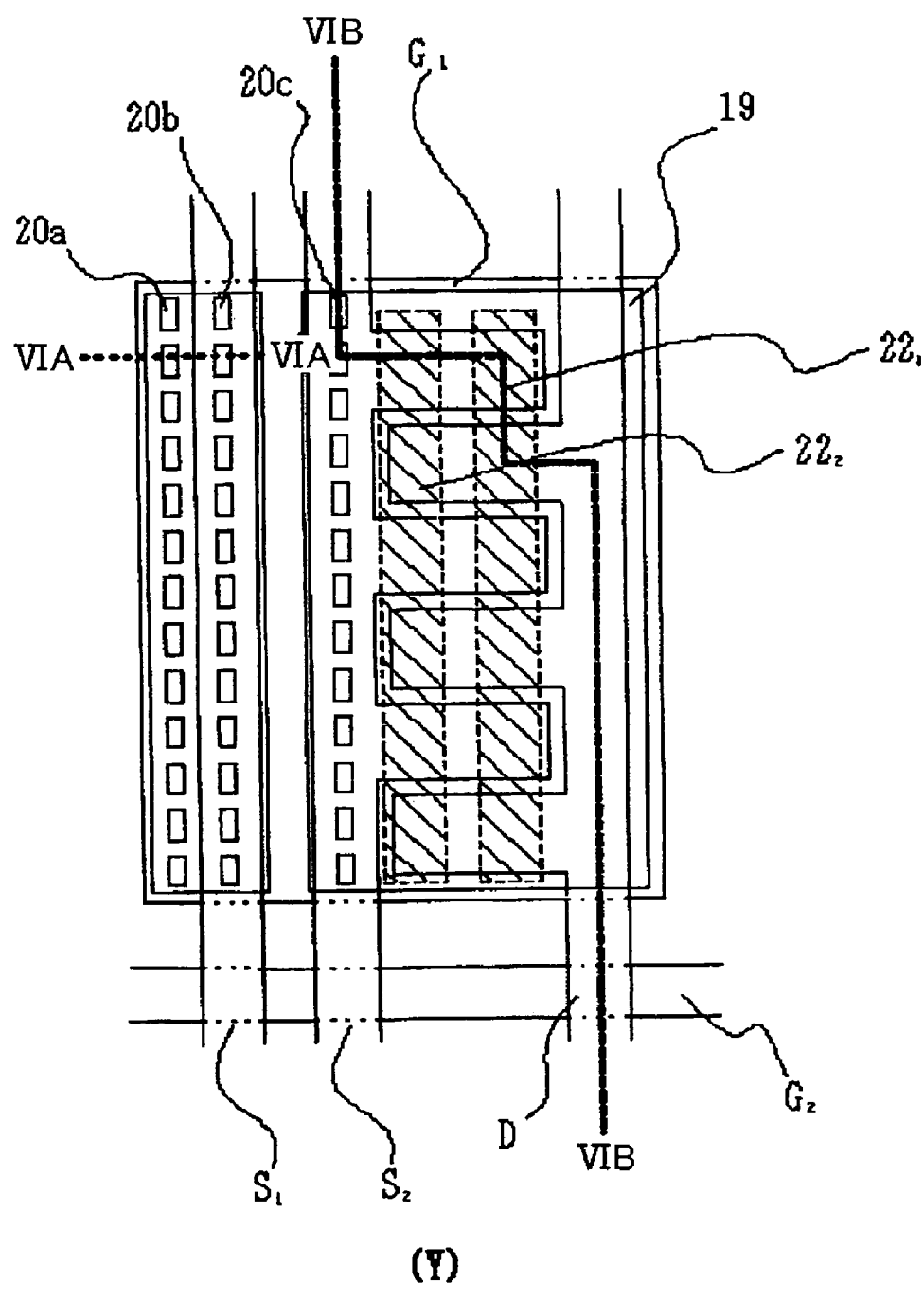
FIG. 5 is an enlarged view of ambient light photosensor Y shown in FIG. 4.
Figures 6A, 6B:
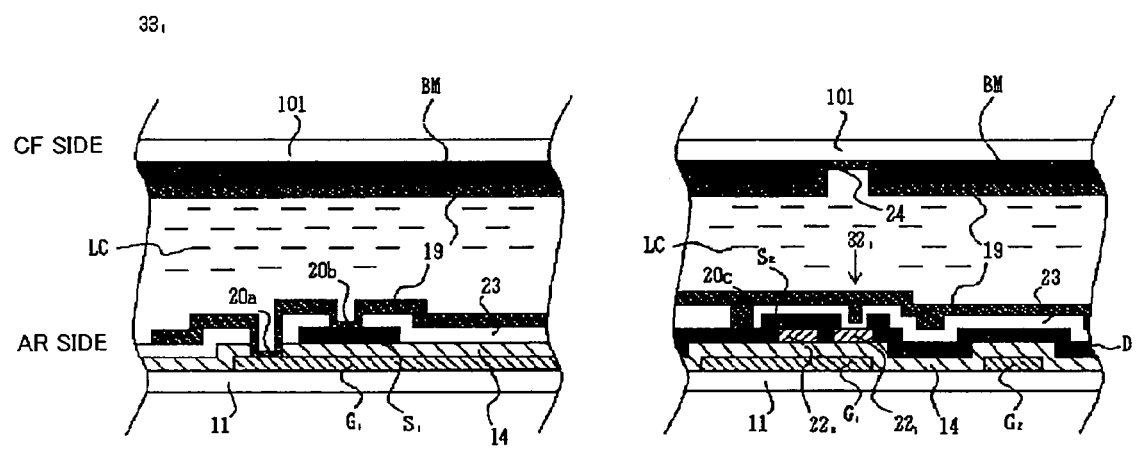
FIG. 6A is a cross-sectional view along VIA-VIA in FIG. 5.
FIG. 6B is a cross-sectional view along VIB-VIB in FIG. 5.

In a display device 10 shown in FIG. 4, scan lines, signal lines, transparent electrodes and so forth are disposed in a multiple matrix arrangement to form a display area 30, a driver IC 31 for driving the display device 10 is provided at an edge of the display area 30, photosensing units $33_1$, $33_2$ are formed in, say, multiple lines along edges of the display area 30 where the driver IC 31 is not provided, and TFT ambient light photosensors $32_1$, $32_2$ are configured in each photosensing unit. The specific structure of the photosensing units $33_1$, $33_2$ will next be described. FIG. 4 is an overall plan view of the photosensing units, FIG. 5 is an enlarged view of the light sensor Y portion shown in FIG. 4, FIG. 6A is a cross-sectional view along VIA-VIA in FIG. 5, and FIG. 6B is a cross-sectional view along VIB-VIB in FIG. 5.

To begin with, the portions at lines VIA-VIA and VIB-VIB of the ambient light photosensor $32_1$ shown in FIGS. 6A and 6B will be described.

At the line portion VIA-VIA, the gate electrode $G_1$ of the TFT ambient light photosensor $32_1$ is formed on the surface of a glass substrate 11. A gate insulator 14 constituted of silicon nitride, silicon oxide or the like is formed so as to cover the surface of the gate electrode $G_1$, and thereover there is formed a source electrode $S_1$ constituted of a metal such as aluminum or molybdenum. Over the source electrode $S_1$ there is formed a passivation film 23 which is an insulator. The structure is such that contact holes 20a, 20b above the gate electrode $G_1$ and source electrode $S_1$ are provided in the gate insulator 14 and passivation film 23, and the gate electrode $G_1$ and source electrode $S_1$ are electrically connected by a transparent electrode 19 via a bridging structure involving the contact holes 20a, 20b.

Next, at line portion VIB-VIB, the gate electrodes $G_1$ and $G_2$ of the TFT ambient light photosensor $32_1$ are formed on the surface of the glass substrate 11. The gate insulator 14 is formed over the gate electrodes $G_1$, and $G_2$, and over the gate electrode $G_1$ there are formed multiple lines of an intrinsic semiconductor layer $22_1$ constituted of amorphous silicon, polycrystal silicon or the like. A source electrode $S_2$ and drain electrode D are provided so as to contact with the intrinsic semiconductor layer $22_1$. Then the drain electrode D is extended over the gate electrode $G_2$ also. Then the passivation film 23 is formed over the source electrode S2 and drain electrode D, and a contact hole 20c is provided over the source electrode $S_2$, effecting electrical connection with the transparent electrode 19.

On the color filter substrate 101, a light blocking film BM is formed and an opening 24 is provided in a location opposite to the position where the ambient light photosensor is provided on the TFT substrate. The opening 24 is formed to have an area slightly larger than that of the ambient light photosensor. This enables reception of exterior light from multiple directions.

An example of the electrical connections of the photosensing unit $33_1$ in the first embodiment will now be described using FIG. 2. In this embodiment, the source electrode S of the TFT ambient light photosensor $32_1$ of the photosensing unit $33_1$ is connected to a fixed voltage Vs (say +2V) via the switch SW, and also, output signals are taken therefrom to the exterior by a signal wire P. Further, a fixed bias voltage (say +10V) is applied to the gate electrode G, and the drain electrode D is connected to a particular voltage source Vref.

Figure 9:
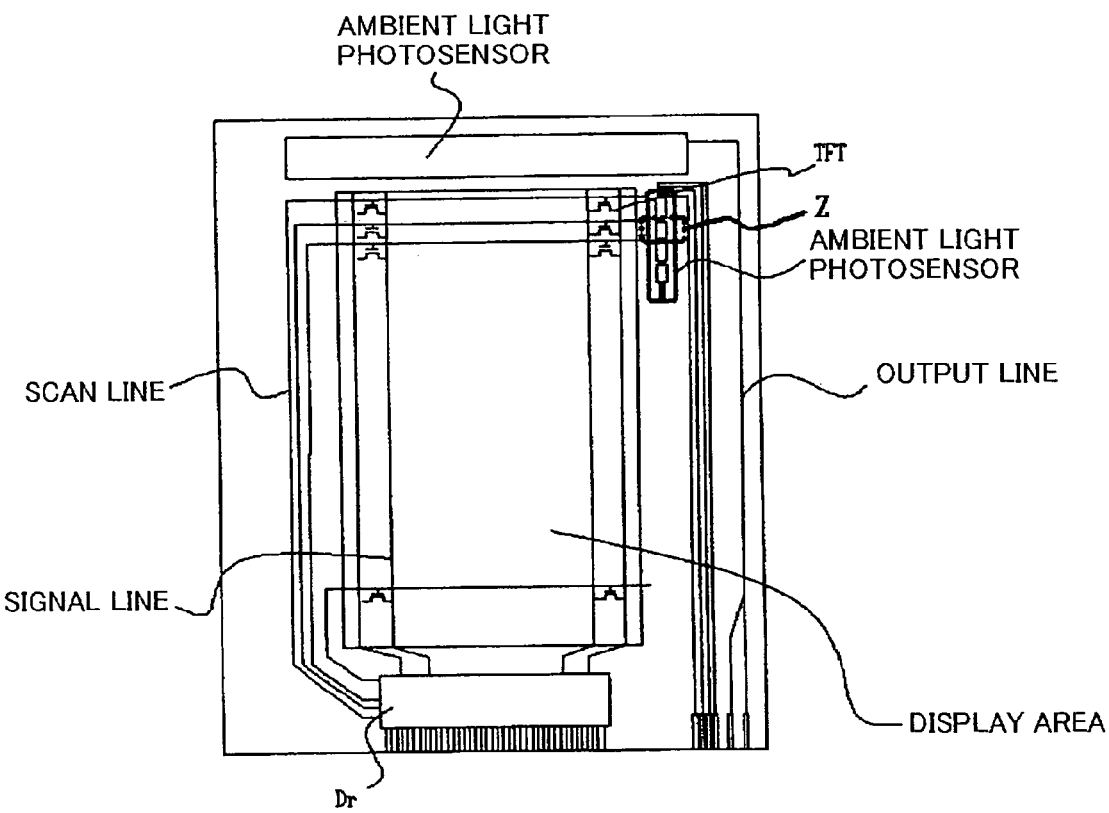
FIG. 9 is a plan view of a related-art display device with built-in ambient light photosensors.
Figure 10:
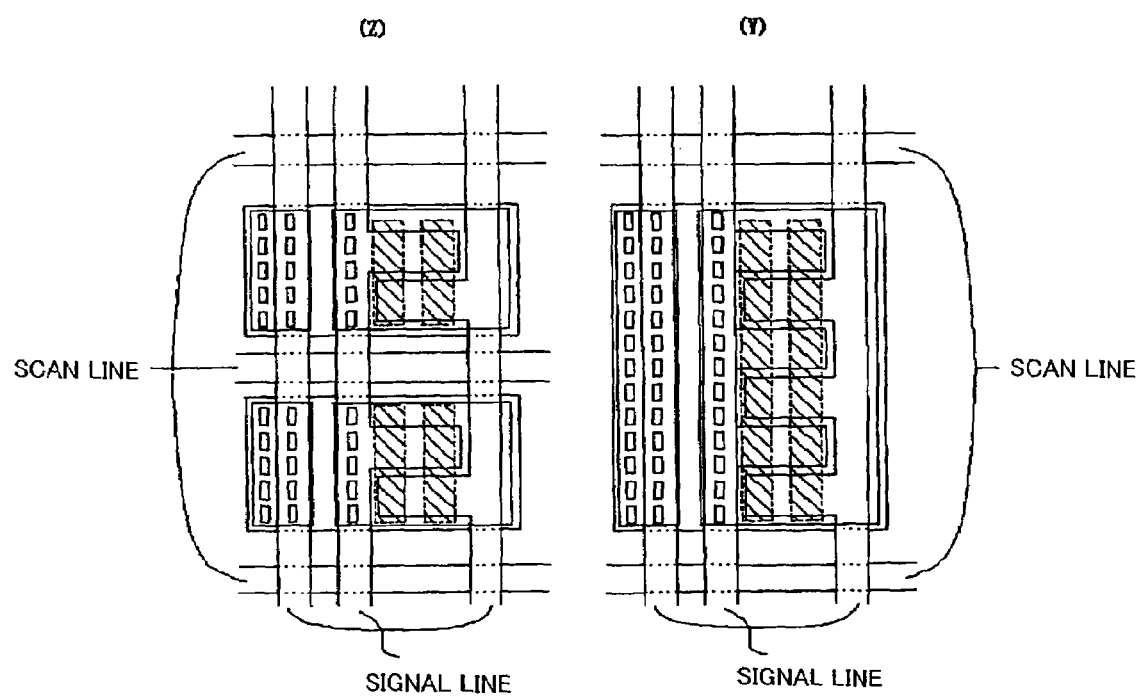
FIG. 10 gives views comparing the sizes of ambient light photosensor Y in FIG. 5 and ambient light photosensor Z in FIG. 9.

In the related art there are several types of lead-around wiring at the display area periphery for input/output of signals from/to the exterior and the display area. Such types include the one-sided wiring configuration, the two-stage wiring configuration whereby lead-around wires are drawn out from each drive circuit in a fixed direction, and the alternating wiring configuration (comb-tooth wiring) whereby lead-around wires are laid alternately from the left and the right. In the ambient light photosensor configuration of the related art, as FIG. 9 shows, the photosensors are disposed at a peripheral portion of the display area, parallel to the scan lines or signal lines. However, in disposing the light sensors parallel to the signal lines during configuration of a wiring pattern such as the one-sided or two-stage, it is difficult to dispose such light sensors close to the display area periphery, because the spacing between the scan lines is constricted by the presence of the scan lines' lead wires. Accordingly, in order to dispose the light sensors in places that are closer to the display area, a configuration such as shown in FIG. 10Z, whereby the photosensors are disposed in between the scan lines, was devised. But the size of the related-art ambient light photosensor disposed between scan lines in FIG. 10Z is small compared to the ambient light photosensor of the present invention in FIG. 10Y. In view of such considerations of the related art, an alternating wiring configuration is adopted in the present invention.

The structure of the ambient light photosensors when the alternating wiring configuration is adopted will now be described.

As FIG. 4 shows, scan lines extending in opposite directions are laid alternately in a comb-tooth formation, odd-numbered lines Pn=2n−1 in one direction and even-numbered lines Qn=2n in the other, and the ambient light photosensors of the present invention are disposed in between pairs of the scan lines of each type, P1, P2, P3, P4 . . . or Q1, Q2, Q3, Q4 . . . (n=1, 2, 3, 4), within the COM wires and as close as possible to the display area. Also, as FIG. 5 shows, the ambient light photosensors disposed in between pairs of the scan lines of each type (P1, P2, P3, P4 . . . or Q1, Q2, Q3, Q4 . . . ) are of a bridging structure, and no TFT ambient light photosensors are disposed at the intersection points between the scan lines, which are for display use, and the signal wires, which are for the light sensors. In this way, the vacant spaces in a complicated wiring pattern can be utilized for disposition of the ambient light photosensors. Also, by making the signal lines as fine as possible so as to reduce the parasitic capacitance vis-à-vis the scan lines, a structure is produced that render small the effects that the intersections between the light sensors' signal lines and the display-use scan lines exert on the image displays and light sensor output.

Using the foregoing configuration enables ambient light photosensors to be disposed not only parallel to the scan lines, but also parallel to the signal lines, at the display area periphery's Pn side or Qn side, or at both. The ambient light photosensor output wires may be common for the photosensors parallel to the scan lines and those parallel to the signal lines, or be separate for each. If common output wires are used, it will be possible to increase the size of the ambient light photosensors to double or treble the size in the related art, and to raise the sensitivity and directionality. If separate output wires are used, it will be possible to select between output from the ambient light photosensors parallel to the scan lines and from those parallel to the signal lines, and thereby flexible responses will be enabled in cases where the photosensor positions employed vary with the user. Also, by adopting this configuration, it becomes possible to structure the ambient light photosensors with an area larger than that of the light sensors in the related art.

The laterally disposed and the longitudinally disposed ambient light photosensors provided on the light blocking film BM of the color filter substrate that opposes the aforementioned AR substrate have light apertures of the same size, and are so structured that their photo-directionalities are equal. Even though such apertures are configured as window-like openings corresponding to each individual ambient light photosensor, it will be permissible to connect all the apertures into a long and narrow aperture formation.

Disposing the ambient light photosensors close to the display area by means of such structure has the effect of rendering the ambient light photosensors unlikely to be hidden by the case. Also, the ambient light photosensors will have constant sensitivity with regard to incident light, whatever the angle at which (direction in which) light incidents into the ambient light photosensors.

Second Embodiment

Figure 7:
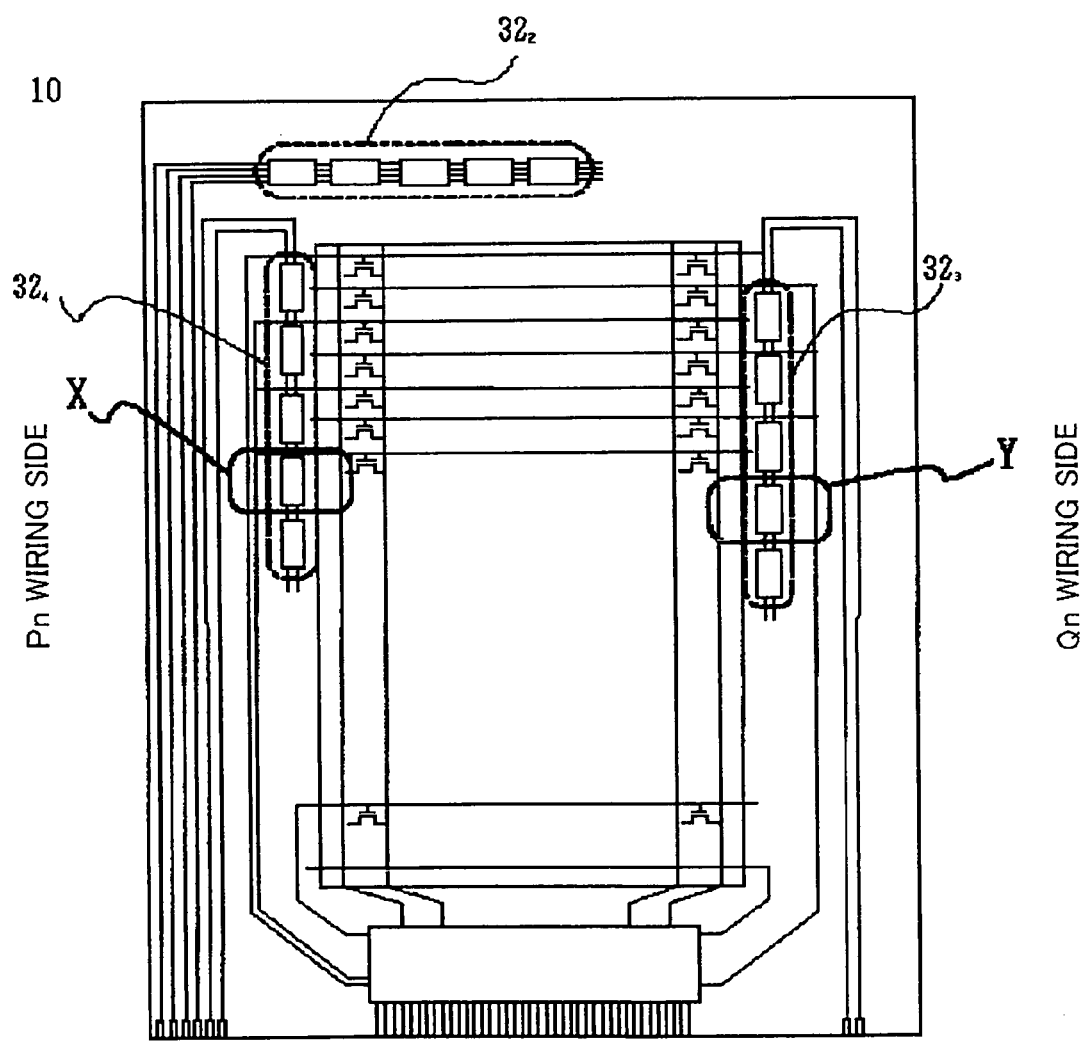
FIG. 7 is a plan view of a display device in a second embodiment of the present invention.
Figure 8:
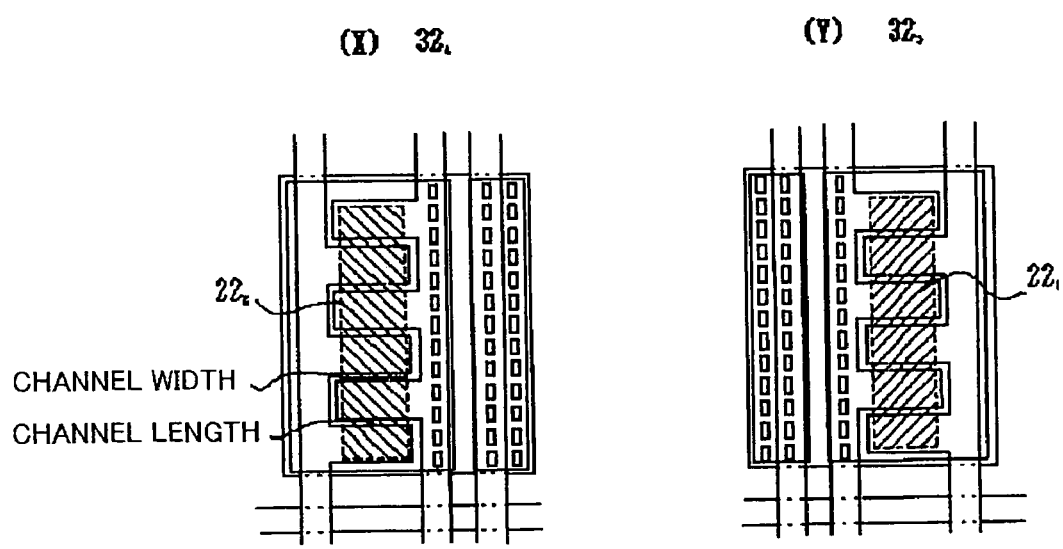
FIG. 8 gives enlarged views of ambient light photosensors X and Y shown in FIG. 7.

The structures of the TFTs and ambient light photosensors in the display device of the second embodiment are the same as those of the TFTs and ambient light photosensors in the display device of the first embodiment shown in FIG. 6, and accordingly a detailed description thereof is omitted here. The second embodiment has a different disposition method, whereby as shown in FIG. 7, the size of the ambient light photosensors $32_2$ disposed parallel to the scan lines can be equal to the combined size of the ambient light photosensors $32_4$ and $32_3$ disposed respectively on the Pn odd-numbered line side and the Qn even-numbered line side. Due to the size being longitudinally split in two, the laterally-disposed ambient light photosensors $32_2$ can be disposed perpendicularly to the Pn side ambient light photosensors $32_4$ and Qn side ambient light photosensors $32_3$, and thereby the ambient light photosensors can be disposed closer to the display area. As a result, the panel case's effect of hiding the ambient light photosensors can be curbed. Also, the intrinsic semiconductor layers $22_1$ and $22_2$ constituting the ambient light photosensor shown in FIG. 5 are arranged in two lines, and when such ambient light photosensor is split in two, one intrinsic semiconductor layer $22_1$, $22_2$ will be disposed for each of the resulting ambient light photosensors $32_4$, $32_3$. Also, due to the longitudinal splitting of the ambient light photosensors, a comparison of FIGS. 5 and 8 shows that the channel length is the same in both, but compared to FIG. 5 the ambient light photosensors $32_4$, $32_3$ in FIG. 8 are structured with one half the channel width, so that combining the two together yields an ambient light photosensor of the same size as the laterally-disposed ambient light photosensors $32_2$. Therefore, using the dual Pn side and Qn side ambient light photosensors $32_4$, $32_3$ simultaneously will yield an effect comparable to that of the laterally-disposed ambient light photosensors $32_2$. The effect of such structure is a narrowing of the rim via disposition of the ambient light photosensors in a long and narrow manner.

Also, the ambient light photosensor TFTs set forth in the first and second embodiments can be formed simultaneously with the display area, which means that the ambient light photosensors can be provided without any increase in the number of processes. Further, the same effects that were set forth in the first embodiment can also be obtained with the second embodiment.

For the ambient light photosensors used, any photoelectrical conversion elements, such as the commonly-known photodiodes, phototransistors, thin film transistor type light sensors, photo-SCRs, photoconductors, or photovoltaic cells, may be selected as appropriate.

Also, since the TFTs, capacitors and switching elements used for the ambient light photosensors can be fabricated simultaneously with fabrication of the TFTs serving as switching elements for the active matrix substrate, there will be no particular need to increase the manufacturing processes in order to provide the TFTs, capacitors and switching elements used for the ambient light photosensors. Moreover, the TFTs, capacitors and switching elements used for the ambient light photosensors are small-sized and furthermore, multiple items of each can easily be formed in lines along the periphery of the display panel's display area, so that there is no particular need to make the display panel large-sized.

What is claimed is:

1. A display device comprising:
    a display unit having switching elements provided on a substrate so as to correspond to individual pixels;
    a first photosensing unit having first light sensors that sense ambient light; and
    a second photosensing unit having second light sensors that sense ambient light;
    the first photosensing unit being disposed along an outer edge of the display unit, and the second photosensing unit being disposed along an outer edge of the display unit that is orthogonal to the direction in which the first photosensing unit is disposed.

2. The display device according to claim 1, wherein the sizes of the first light sensors and the second light sensors are equal.

3. The display device according to claim 1, wherein the display device has a third photosensing unit having third light sensors, and the third photosensing unit is disposed in a position opposing the second photosensing unit, so that the display unit is located therebetween.

4. The display device according to claim 3, wherein the size of the first light sensors is equal to the combined sizes of the second light sensors and the third light sensors.

5. The display device according to claim 4, wherein
    the display unit comprises:
        thin film transistors as switching elements;
        scan lines that are connected to the gate electrodes of the thin film transistors; and
        signal lines that are connected to the source electrodes of the thin film transistors; wherein
    the scan lines or the signal lines are extended exterior to the display device, such wiring extensions cross over the second and third photosensing units, the second and third light sensors are disposed in between such wiring extensions, and adjacent light sensors are electrically connected via bridging connections formed by wires that cross the scan line wiring extensions.

* * * * *